(12) United States Patent
Fujii

(10) Patent No.: US 9,508,872 B2
(45) Date of Patent: Nov. 29, 2016

(54) METHOD FOR MANUFACTURING SEMICONDUCTOR DEVICE AND PIN DIODE

(71) Applicant: Mitsubishi Electric Corporation, Tokyo (JP)

(72) Inventor: Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/888,163

(22) PCT Filed: Jul. 11, 2013

(86) PCT No.: PCT/JP2013/068986
§ 371 (c)(1),
(2) Date: Oct. 30, 2015

(87) PCT Pub. No.: WO2015/004774
PCT Pub. Date: Jan. 15, 2015

(65) Prior Publication Data
US 2016/0079442 A1 Mar. 17, 2016

(51) Int. Cl.
| | |
|---|---|
| H01L 21/20 | (2006.01) |
| H01L 29/868 | (2006.01) |
| H01L 27/06 | (2006.01) |
| H01L 21/02 | (2006.01) |
| H01L 21/324 | (2006.01) |
| H01L 29/66 | (2006.01) |

(Continued)

(52) U.S. Cl.
CPC ....... *H01L 29/868* (2013.01); *H01L 21/02532* (2013.01); *H01L 21/02667* (2013.01); *H01L 21/324* (2013.01); *H01L 27/0629* (2013.01); *H01L 27/0664* (2013.01); *H01L 29/6609* (2013.01); *H01L 29/7397* (2013.01); *H01L 23/34* (2013.01); *H01L 2924/0002* (2013.01)

(58) Field of Classification Search
CPC ................. H01L 29/9906; H01L 29/6609
USPC .................... 257/656; 438/486–489
See application file for complete search history.

(56) References Cited

U.S. PATENT DOCUMENTS

| | | |
|---|---|---|
| 2001/0007432 A1 | 7/2001 | Ayres |
| 2008/0246064 A1 | 10/2008 | Kimura |

(Continued)

FOREIGN PATENT DOCUMENTS

| | | |
|---|---|---|
| JP | S59-106162 A | 6/1984 |
| JP | H02-051280 A | 2/1990 |

(Continued)

OTHER PUBLICATIONS

International Search Report, PCT/JP2013/068986, Oct. 15, 2013.

(Continued)

*Primary Examiner* — Dung Le
(74) *Attorney, Agent, or Firm* — Studebaker & Brackett PC

(57) ABSTRACT

An IGBT (15) is formed in a semiconductor substrate (1). A temperature sense diode (17) made of polysilicon or amorphous silicon is formed on the semiconductor substrate (1). After forming the IGBT (15), the temperature sense diode (17) is divided into a plurality of diodes by selectively oxidizing or sublimating part of the temperature sense diode (17). Thus, influences of variations in finished dimension of polysilicon on the characteristics can be eliminated. As a result, it is possible to reduce the size while reducing characteristic variations.

14 Claims, 11 Drawing Sheets

(51) Int. Cl.
  *H01L 29/739* (2006.01)
  *H01L 23/34* (2006.01)

(56) References Cited

U.S. PATENT DOCUMENTS

2009/0078992 A1    3/2009  Kaneko
2009/0283739 A1*   11/2009 Kiyotoshi .......... H01L 27/0688
                                                        257/4
2014/0353665 A1*   12/2014 Fujii .................. H01L 21/18
                                                        257/48

FOREIGN PATENT DOCUMENTS

| JP | H11-097664 A  | 4/1999  |
|----|---------------|---------|
| JP | 2001-168357 A | 6/2001  |
| JP | 2003-520441 A | 7/2003  |
| JP | 2007-220814 A | 8/2007  |
| JP | 2007-294670 A | 11/2007 |
| JP | 2008-182209 A | 8/2008  |
| JP | 2009-076761 A | 4/2009  |

OTHER PUBLICATIONS

Translation of the International Preliminary Report on Patentability issue in PCT/JP2013/068986 on Jan. 21, 2016.

An Office Action issued by the Japanese Patent Office on Dec. 22, 2015, which corresponds to Japanese Patent Application No. 2015-526096 and is related to U.S. Appl. No. 14/888,163; with English language partial translation.

* cited by examiner

METHOD FOR MANUFACTURING SEMICONDUCTOR DEVICE AND PIN DIODE

TECHNICAL FIELD

The present invention relates to a method for manufacturing a semiconductor device that forms a PIN diode using polysilicon or amorphous silicon.

BACKGROUND ART

In power modules such as IPM, a temperature sense diode is incorporated in an IGBT to monitor an operating temperature. The temperature sense diode is a PIN diode made of polysilicon or amorphous silicon (e.g., see Patent Literature 1). Temperature control and protection are performed by monitoring VF characteristics of this diode. The temperature sense diode is required to have temperature dependency of high-accuracy VF characteristics to provide high-accuracy temperature assurance. Furthermore, the temperature sense diode is also required to provide high-speed response, in a case where there is a drastic temperature rise in a power chip due to abnormal operation or the like, so as to instantaneously respond thereto.

CITATION LIST

Patent Literature

Patent Literature 1: National Publication of International Patent Application No. 2003-520441

SUMMARY OF INVENTION

Technical Problem

Characteristics of a polysilicon diode are determined by a film thickness of polysilicon, amount of ion implantation, heat treatment conditions (temperature, time), finished dimension of polysilicon, and polysilicon film quality (grain size). Variations in the amount of ion implantation and finished dimension of polysilicon can be ignored if the area of the diode is increased, which is, however, accompanied by a problem that the area of the entire apparatus increases. There is another problem that the diode is affected by heat treatment when the IGBT is formed and characteristics of the diode vary.

The present invention has been implemented to solve the above-described problems and it is an object of the present invention to provide a method for manufacturing a semiconductor device capable of reducing the size of the device while reducing characteristic variations.

Means for Solving the Problems

A method for manufacturing a semiconductor device according to the present invention includes: forming a transistor in a semiconductor substrate; forming a PIN diode made of polysilicon or amorphous silicon on the semiconductor substrate; and after forming the transistor, selectively oxidizing or sublimating part of the PIN diode to divide the PIN diode into a plurality of diodes.

Advantageous Effects of Invention

The present invention makes it possible to reduce the size of the device while reducing characteristic variations.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
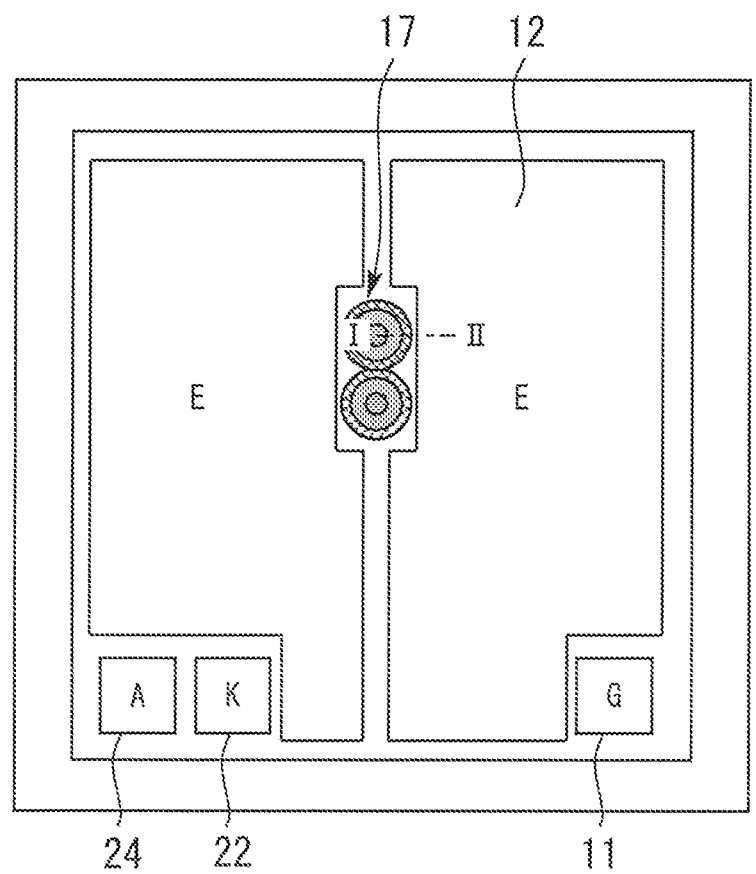
FIG. 1 is a plan view illustrating a semiconductor device according to Embodiment 1 of the present invention.
Figure 2:
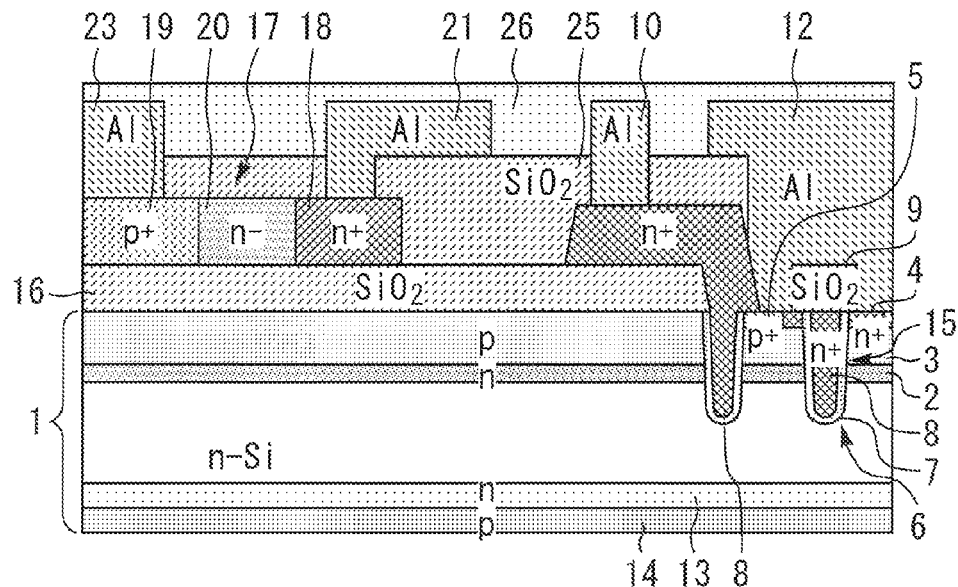
FIG. 2 is a cross-sectional view along a line I-II of FIG. 1.

FIG. 1 is a plan view illustrating a semiconductor device according to Embodiment 1 of the present invention. FIG. 2 is a cross-sectional view along a line I-II of FIG. 1. An n-type layer 2 and a p-type base layer 3 are formed in that order on a surface of a semiconductor substrate 1 made of n-type silicon. An n$^+$-type emitter layer 4 and a p$^+$-type contact layer 5 are formed in the p-type base layer 3. A trench 6 is formed on the surface side of the semiconductor substrate 1 and a trench gate 8 made of n$^+$-type polysilicon is formed in the trench 6 via a gate insulating film 7.

An oxide film 9 is formed on the trench gate 8. The trench gate 8 is connected to a gate pad 11 via an Al wire 10. An emitter electrode 12 made of Al is connected to the p$^+$-type contact layer 5. An n-type buffer layer 13 and a p-type collector layer 14 are formed on a rear surface of the semiconductor substrate 1. An IGBT 15 (Insulated Gate Bipolar Transistor) is constructed of these components.

An oxide film 16 made of SiO$_2$ having a thickness of 3000 Å to 10000 Å is formed on the surface of the semiconductor substrate 1. A temperature sense diode 17 is formed on this oxide film 16. The temperature sense diode 17 is electrically separated from the semiconductor substrate 1 via the oxide film 16. The temperature sense diode 17 includes an n$^+$-type layer 18, a p$^+$-type layer 19 and an n$^-$-type layer 20 which are concentrically arranged from the center toward the outside thereof. The n$^+$-type layer 18 is connected to a cathode pad 22 via an Al wire 21 and the p$^+$-type layer 19 is connected to an anode pad 24 via an Al wire 23.

An oxide film 25 is formed so as to cover the temperature sense diode 17. The oxide film 25 and the Al wires 10, 21 and 23 are covered with a protective film 26. The protective film 26 is an insulating film having a thickness of 2000 Å to 10000 Å and a refractive index of 1.8 to 2.2 laminated on a SInSiN semi-insulating film having a thickness of 2000 Å to 10000 Å and a refractive index of 2.2 to 2.7.

Figure 3:
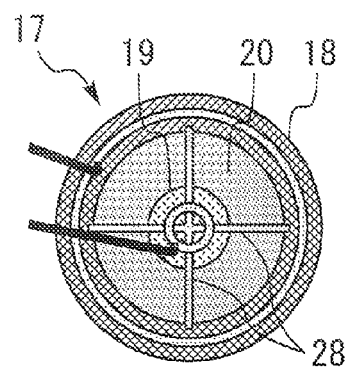
FIG. 3 is a plan view illustrating the diode according to Embodiment 1 of the present invention.
Figure 3:
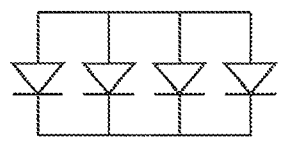

FIG. 3 is a plan view illustrating the diode according to Embodiment 1 of the present invention. The temperature sense diode 17 is made of polysilicon or amorphous silicon and is divided into four diodes with part of the n$^+$-type layer 18 and the n-type layer 20 selectively oxidized. The four divided diodes are connected in parallel.

Figure 7:
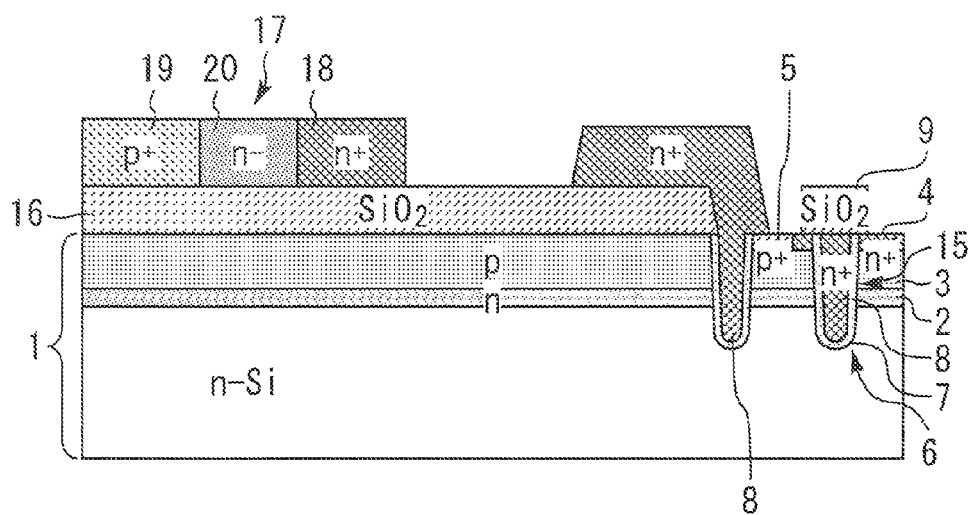
FIG. 7 is a cross-sectional view illustrating the method for manufacturing a semiconductor device according to Embodiment 1 of the present invention.
Figure 8:
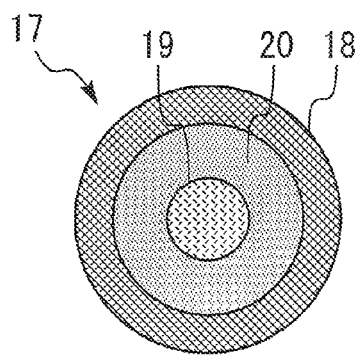
FIG. 8 is a plan view illustrating the method for manufacturing a semiconductor device according to Embodiment 1 of the present invention.
Figure 9:
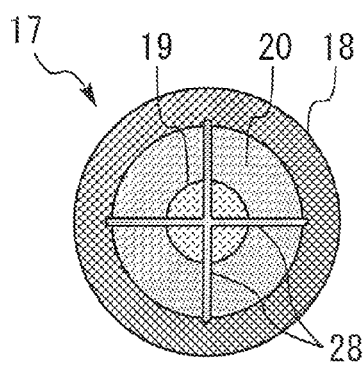
FIG. 9 is a plan view illustrating the method for manufacturing a semiconductor device according to Embodiment 1 of the present invention.

Next, a method for manufacturing a semiconductor device of the present embodiment will be described. FIGS. 4 to 7 are cross-sectional views illustrating the method for manufacturing a semiconductor device according to Embodiment 1 of the present invention, and FIG. 8 and FIG. 9 are plan views illustrating the method for manufacturing a semiconductor device according to Embodiment 1 of the present invention. However, FIG. 8 and FIG. 9 are partially enlarged views of the diode.

Figure 4:
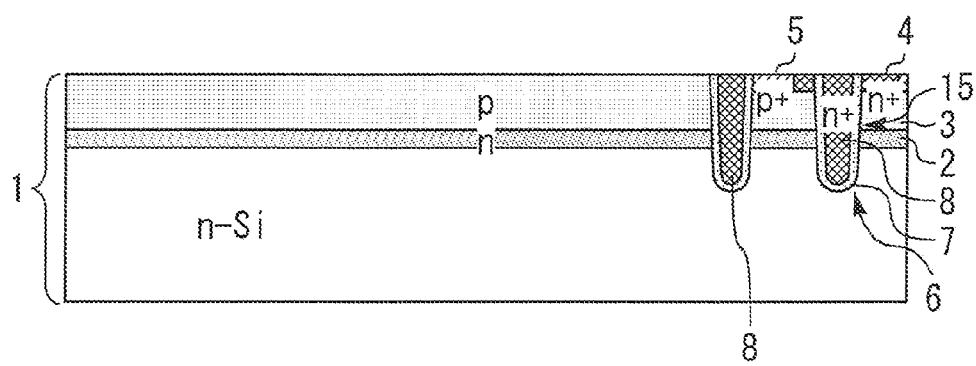
FIG. 4 is a cross-sectional view illustrating the method for manufacturing a semiconductor device according to Embodiment 1 of the present invention.
Figure 5:
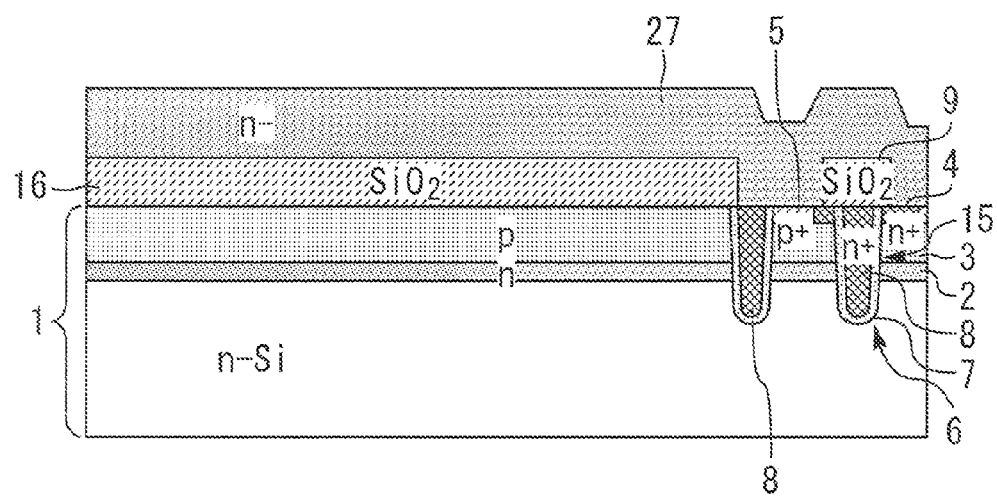
FIG. 5 is a cross-sectional view illustrating the method for manufacturing a semiconductor device according to Embodiment 1 of the present invention.

First, as shown in FIG. 4, a MOS structure on the top surface side of the substrate of the IGBT 15 is formed. Next, as shown in FIG. 5, oxide films 9 and 16 are formed by stacking an oxide film on the semiconductor substrate 1 and patterning the oxide film. A polysilicon film 27 having a thickness of 500 Å to 5000 Å is formed, phosphor or arsenic of 1E12 to 1E14 [1/cm$^2$] is implanted over the whole surface and a concentration of the n$^-$-type layer 20 is determined. Note that doped polysilicon or amorphous silicon may also be used instead of the polysilicon film 27. In the case of a p$^+$p$^-$n$^+$-type PIN diode, boron is implanted instead of phosphor or arsenic.

Figure 6:
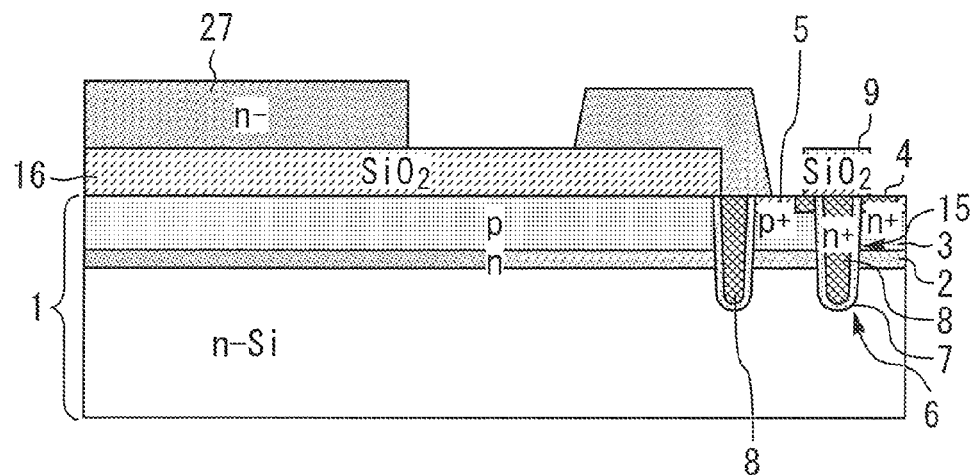
FIG. 6 is a cross-sectional view illustrating the method for manufacturing a semiconductor device according to Embodiment 1 of the present invention.

Next, as shown in FIG. 6, the polysilicon film 27 is patterned through a photoengraving process to form a structure of the temperature sense diode 17. Next, as shown in FIG. 7, boron of 1E13 to 1E16 [1/cm$^2$] is implanted into the part of the p$^+$-type layer 19, phosphor or arsenic of 1E13 to 1E16 [1/cm$^2$] is implanted into the part of the n$^+$-type layer 18 and activated through heat treatment (900° C. to 1200° C., 30 to 120 minutes). In this stage, the temperature sense diode 17 is as shown in FIG. 8.

Next, as shown in FIG. 9, the temperature sense diode 17 is divided into a plurality of diodes by selectively performing RTA (Rapid Thermal Annealing: laser annealing, electron beam annealing or lamp annealing, pulse lamp annealing or the like) in an oxygen atmosphere, selectively oxidizing part of the temperature sense diode 17 and forming an oxide film 28.

Next, the oxide film 25 having a thickness of 3000 Å to 10000 Å is stacked, the contact part is opened, and then an Al film having a thickness of 1 μm to 10 μm is formed through vapor deposition or sputtering. The Al film is patterned to form the Al wires 10, 21 and 23. Next, the protective film 26 is formed and the protective film 26 on the emitter electrode 12 or gate pad 11 or the like to be wired is removed. Lastly, the rear surface of the semiconductor substrate 1 is polished to a desired thickness and the n-type buffer layer 13 and the p-type collector layer 14 are formed on the rear surface of the semiconductor substrate 1 through ion implantation and heat treatment.

In the present embodiment, a plurality of small diodes can be formed by selectively oxidizing part of the temperature sense diode 17. Dividing the temperature sense diode 17 into a plurality of diodes makes it possible to eliminate influences of variations in finished dimension of polysilicon on the characteristics. As a result, it is possible to reduce the size of the diode while reducing characteristic variations.

Embodiment 2

Figure 10:
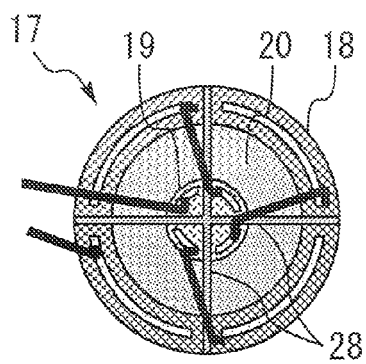
FIG. 10 is a plan view illustrating a diode according to Embodiment 2 of the present invention.
Figure 10:

FIG. 10 is a plan view illustrating a diode according to Embodiment 2 of the present invention. In the present embodiment, four divided diodes are connected in series. The rest of the configuration is the same as that of Embodiment 1. Connections of these divided diodes can be set freely.

Embodiment 3

Figure 11:
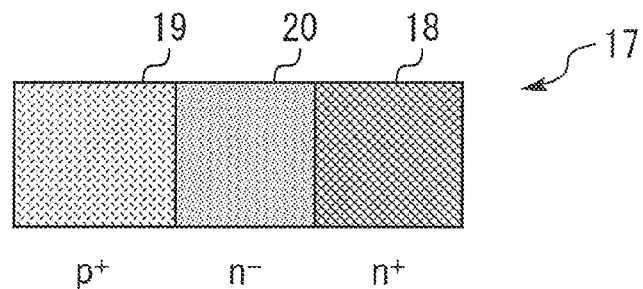
FIG. 11 is a cross-sectional view illustrating a diode according to Embodiment 3 of the present invention.

FIG. 11 is a cross-sectional view illustrating a diode according to Embodiment 3 of the present invention. In the present embodiment, the n$^+$-type layer 18, the n$^-$-type layer 20 and the p$^+$-type layer 19 of the temperature sense diode 17 are respectively subjected to heat treatment and re-crystalized through RTA. In this case, an amount of heat equal to or less than a boiling point of silicon is added.

The resistance of polysilicon is the sum of the resistance of grains and the resistance of the grain boundary. Since the grain boundary functions as a trap level, the greater the number of boundaries, the worse the response becomes. Furthermore, conditions of the grain boundaries vary and characteristics fluctuate due to continuous high-temperature electrical conduction. Thus, these problems can be solved by applying heat treatment and re-crystallization to the PIN diode.

Note that without being limited to re-crystallization of the whole polysilicon, re-crystallization may also be performed to such an extent that part of the polysilicon is re-crystalized so as to increase the grain size. This allows characteristics of the PIN diode to be adjusted. The re-crystallization processing may be performed at any point in time, before or after formation of the oxide film 28 or before or after impurity implantation if the re-crystallization processing takes place after polysilicon film formation.

Embodiment 4

Figure 12:
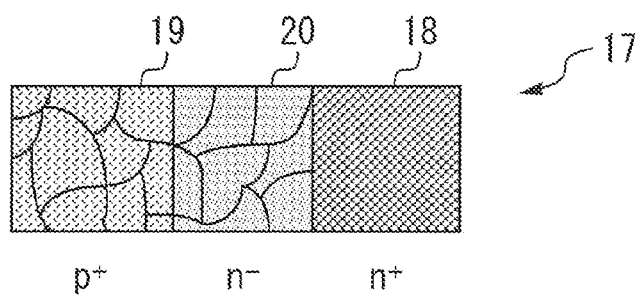
FIG. 12 is a cross-sectional view illustrating a diode according to Embodiment 4 of the present invention.

FIG. 12 is a cross-sectional view illustrating a diode according to Embodiment 4 of the present invention. When a diode is downsized, its contact resistance increases. Thus, in the present embodiment, the $n^+$-type layer 18 is selectively re-crystalized. This makes it possible to reduce the contact resistance of the cathode.

Embodiment 5

Figure 13:
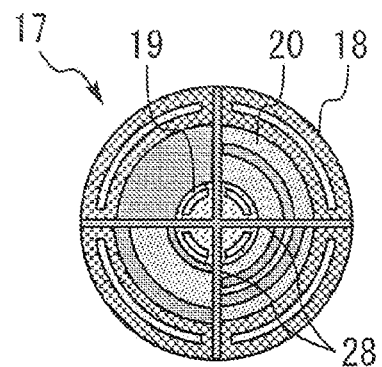
FIG. 13 is a plan view illustrating a diode according to Embodiment 5 of the present invention.

FIG. 13 is a plan view illustrating a diode according to Embodiment 5 of the present invention. When a diode is downsized, ESD resistance decreases. Thus, in the present embodiment, the $n^-$-type layer 20 is selectively re-crystalized. This reduces current concentration by a surge current, and can thereby improve ESD resistance. Note that by changing the degree of re-crystallization, it is possible to adjust characteristics.

Embodiment 6

Figure 14:
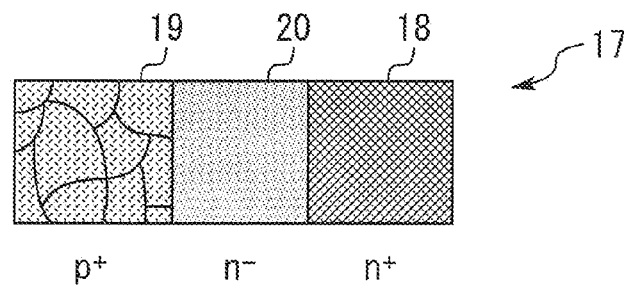
FIG. 14 is a cross-sectional view illustrating a diode according to Embodiment 6 of the present invention.

FIG. 14 is a cross-sectional view illustrating a diode according to Embodiment 6 of the present invention. In the present embodiment, the $n^+$-type layer 18 and the $n^-$-type layer 20 are selectively re-crystalized. It is thereby possible to obtain the effects of Embodiments 4 and 5.

Embodiment 7

Figure 15:
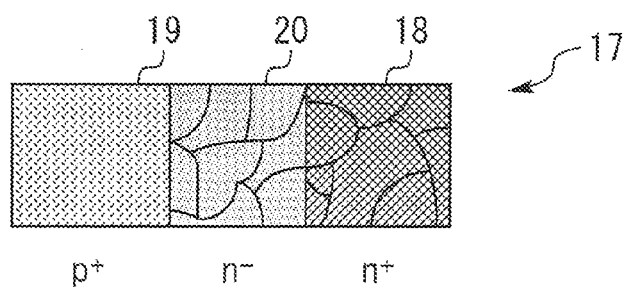
FIG. 15 is a cross-sectional view illustrating a diode according to Embodiment 7 of the present invention.

FIG. 15 is a cross-sectional view illustrating a diode according to Embodiment 7 of the present invention. In the present embodiment, the $p^+$-type layer 19 is selectively re-crystalized. This makes it possible to reduce the contact resistance of the anode. Moreover, since this prevents hole annihilation on the grain boundary, it is possible to realize high-speed response.

Embodiment 8

Figure 16:
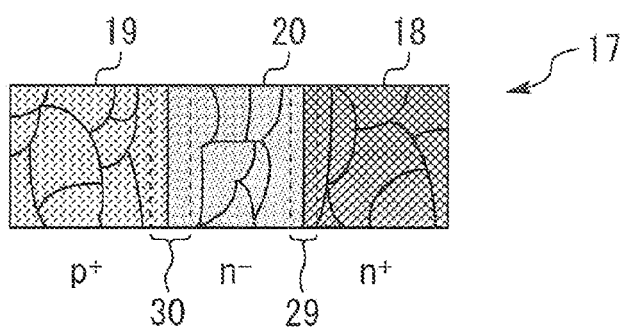
FIG. 16 is a cross-sectional view illustrating a diode according to Embodiment 8 of the present invention.

FIG. 16 is a cross-sectional view illustrating a diode according to Embodiment 8 of the present invention. In the present embodiment, a bonding region 29 between the $n^+$-type layer 18 and the $n^-$-type layer 20, and a bonding region 30 between the $p^+$-type layer 19 and the $n^-$-type layer 20 are selectively re-crystalized. This makes it possible to reduce a leakage current and realize high-speed response.

Embodiment 9

Figure 17:
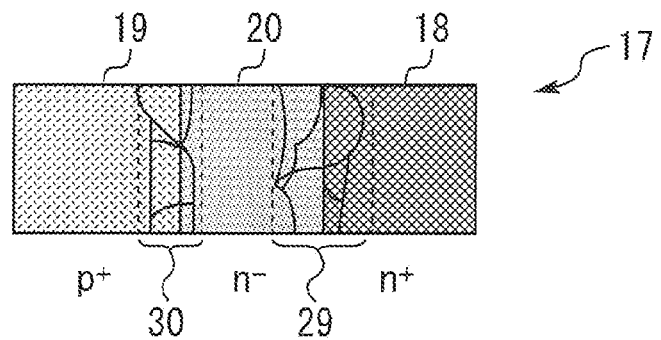
FIG. 17 is a cross-sectional view illustrating a diode according to Embodiment 9 of the present invention.

FIG. 17 is a cross-sectional view illustrating a diode according to Embodiment 9 of the present invention. In the present embodiment, regions excluding the bonding regions 29 and 30 are selectively re-crystalized. The effects of Embodiments 4 to 7 can be obtained in this case, too.

Embodiment 10

Figure 18:
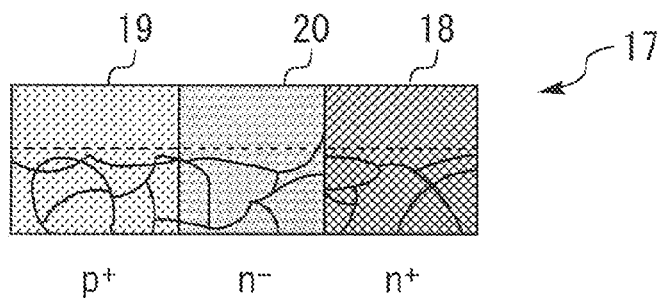
FIG. 18 is a cross-sectional view illustrating a diode according to Embodiment 10 of the present invention.

FIG. 18 is a cross-sectional view illustrating a diode according to Embodiment 10 of the present invention. In the present embodiment, a higher layer part of each layer of the temperature sense diode 17 is selectively re-crystalized. This results in a structure in which each layer includes two resistors connected in parallel. It is possible to adjust characteristics of the PIN diode according to the degree of re-crystallization.

Embodiment 11

Figure 19:
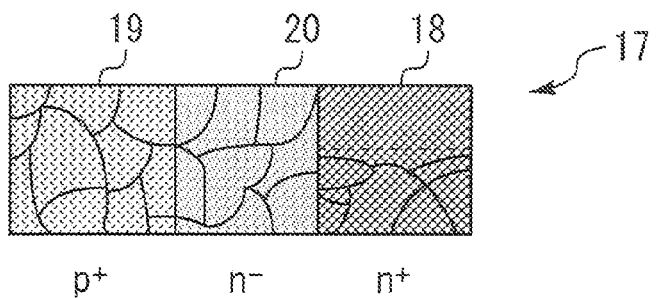
FIG. 19 is a cross-sectional view illustrating a diode according to Embodiment 11 of the present invention.

FIG. 19 is a cross-sectional view illustrating a diode according to Embodiment 11 of the present invention. In the present embodiment, the upper layer part of the $n^+$-type layer 18 of the temperature sense diode 17 is selectively re-crystalized. The contact resistance of the cathode can thereby be reduced.

Embodiment 12

Figure 20:
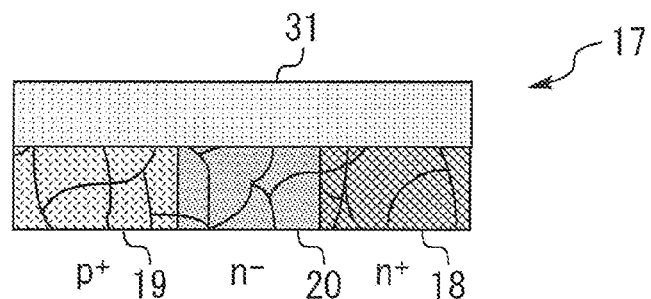
FIG. 20 is a cross-sectional view illustrating a diode according to Embodiment 12 of the present invention.

FIG. 20 is a cross-sectional view illustrating a diode according to Embodiment 12 of the present invention. There are considerable influences of variations in the thickness of the polysilicon film 27 on VF characteristics. Thus, in the present embodiment, an oxide film 31 is formed by oxidizing only the upper layer part of each layer of the temperature sense diode 17. This makes it possible to control the thickness of the lower layer part with high accuracy, and thereby reduce VF variations due to variations in the thickness of the polysilicon film 27. Moreover, characteristics can be adjusted by adjusting the region to be oxidized and the thickness thereof. Since the oxide film 31 can be formed accurately by selectively applying heat treatment through RTA, it is possible to adjust characteristics of the temperature sense diode 17 with high accuracy.

Embodiment 13

Figure 21:
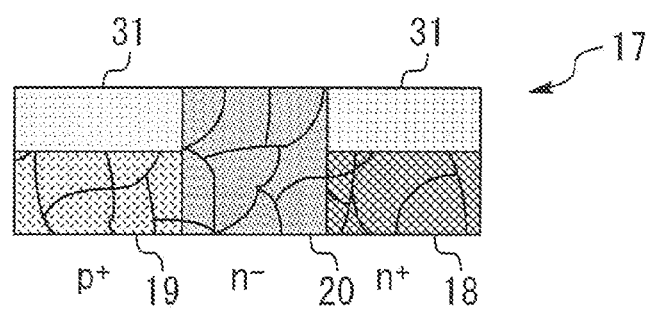
FIG. 21 is a cross-sectional view illustrating a diode according to Embodiment 13 of the present invention.
Figure 22:
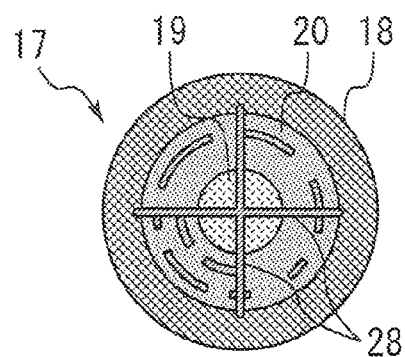
FIG. 22 is a plan view illustrating the lower layer part of the diode according to Embodiment 13 of the present invention.

FIG. 21 is a cross-sectional view illustrating a diode according to Embodiment 13 of the present invention. FIG. 22 is a plan view illustrating the lower layer part of the diode according to Embodiment 13 of the present invention. In the present embodiment, the upper layer part of the $p^+$-type layer 19 and the upper layer part of the $n^+$-type layer 18 are selectively oxidized to form the oxide film 31.

Since the polysilicon film 27 is formed on the oxide film 16, there is a large difference in height between the semiconductor substrate 1 and the polysilicon film 27. Therefore, when the oxide film 25 is etched to simultaneously form a contact hole that reaches the semiconductor substrate 1 and a contact hole that reaches the temperature sense diode 17, damage by over-etching may be added to the temperature sense diode 17, increasing contact resistance.

In contrast, in the present embodiment, since the differences in height of the lower layer part of the $p^+$-type layer 19 and the lower layer part of the $n^+$-type layer 18 from the semiconductor substrate 1 are small, damage due to contact etching is reduced and the contact resistance can be reduced. Since the $n^-$-type layer 20 is not oxidized and remains thick, it is possible to obtain high ESD resistance without narrowing the path of a current that flows through the $n^-$-type layer 20.

Embodiment 14

Figure 23:
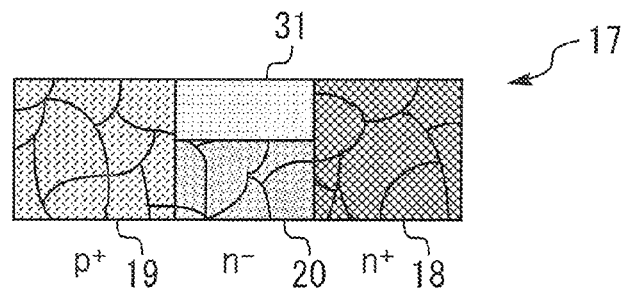
FIG. 23 is a cross-sectional view illustrating a diode according to Embodiment 14 of the present invention.

FIG. 23 is a cross-sectional view illustrating a diode according to Embodiment 14 of the present invention. In the present embodiment, the upper layer part of the $n^-$-type layer 20 is selectively oxidized. It is thereby possible to adjust the width of the current path without changing the amounts of implantation of electrons and holes, and thereby adjust characteristics with higher accuracy. It is also possible to realize a high current density operation.

Embodiment 15

Figure 24:
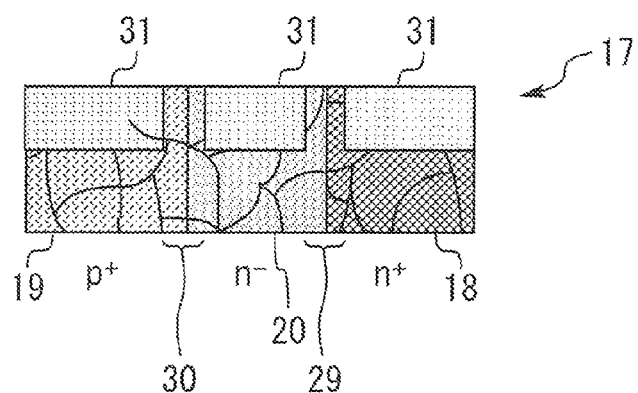
FIG. 24 is a cross-sectional view illustrating a diode according to Embodiment 15 of the present invention.

FIG. 24 is a cross-sectional view illustrating a diode according to Embodiment 15 of the present invention. In the present embodiment, the upper layer parts of the regions excluding bonding regions 29 and 30 are selectively oxidized. It is thereby possible to obtain the effects of Embodiments 13 and 14, and also realize a high-temperature operation.

Embodiment 16

Figure 25:
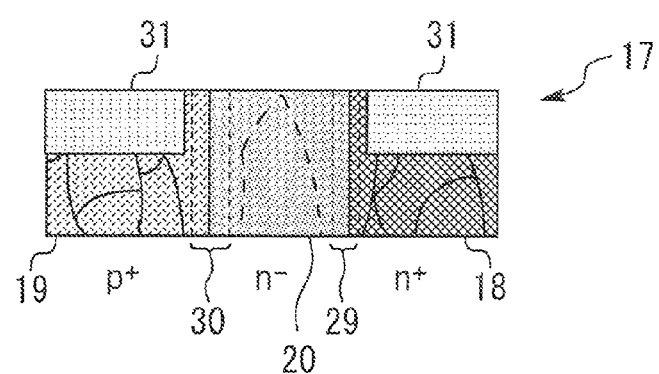
FIG. 25 is a cross-sectional view illustrating a diode according to Embodiment 16 of the present invention.
Figure 26:
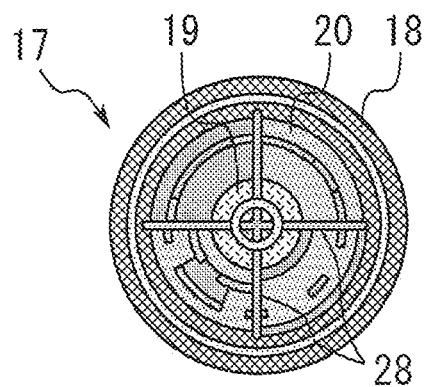
FIG. 26 is a plan view illustrating the diode according to Embodiment 16 of the present invention.

FIG. 25 is a cross-sectional view illustrating a diode according to Embodiment 16 of the present invention. FIG. 26 is a plan view illustrating the diode according to Embodiment 16 of the present invention. In the present embodiment, the upper layer part of the $p^+$-type layer 19 and the upper layer part of the $n^+$-type layer 18 are selectively oxidized to form the oxide film 31. The bonding regions 29 and 30 are selectively re-crystalized. The effects of the Embodiments 8 and 13 can thereby be obtained.

Embodiment 17

Figure 27:
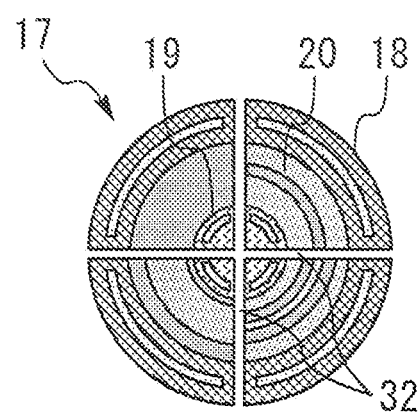
FIG. 27 is a plan view illustrating a diode according to Embodiment 17 of the present invention.

FIG. 27 is a plan view illustrating a diode according to Embodiment 17 of the present invention. In the present embodiment, part of the temperature sense diode 17 is selectively sublimated through RTA to form separation grooves 32. The temperature sense diode 17 is divided into a plurality of diodes through the separation grooves 32. This makes it possible to obtain effects similar to those of Embodiment 1. Moreover, since power of RTA and an atmosphere need not be adjusted, the diode can be formed in a simple manner.

Note that the semiconductor substrate 1 is not limited to one formed of silicon, but may be one formed of a wide-band-gap semiconductor having a wider gap than silicon. Examples of the wide-band-gap semiconductor include silicon carbide, nitride gallium-based material or diamond. A semiconductor device formed of such a wide-band-gap semiconductor has a high withstand voltage and a high maximum allowable current density, and can thereby be downsized. Using this downsized apparatus makes it possible to also downsize a semiconductor module incorporating this apparatus. Moreover, since the apparatus has high heat resistance, it is possible to downsize radiator fins of a heat sink and adopt air cooling instead of water cooling, and can thereby further downsize the semiconductor module. In addition, since power loss of the apparatus is low and high efficiency is achieved, it is possible to improve efficiency of the semiconductor module.

Description Of Symbols 1 semiconductor substrate, 15 IGBT (transistor), 17 temperature sense diode (PIN diode), 18 $n^+$-type layer (n-type layer), 19 $p^+$-type layer (p-type layer), 20 $n^-$-type layer (i-type layer), 29,30 bonding region.

The invention claimed is:

1. A method for manufacturing a semiconductor device comprising:
   forming a transistor in a semiconductor substrate;
   forming a PIN diode made of polysilicon or amorphous silicon on the semiconductor substrate; and
   after forming the transistor, selectively oxidizing or sublimating part of the PIN diode to divide the PIN diode into a plurality of diodes.

2. The method for manufacturing a semiconductor device of claim 1, further comprising performing re-crystallization, oxidization, or change of grain size by selectively applying heat treatment to part of the plurality of diodes.

3. The method for manufacturing a semiconductor device of claim 2, wherein an n-type layer of the PIN diode is selectively re-crystalized.

4. The method for manufacturing a semiconductor device of claim 2, wherein an i-type layer of the PIN diode is selectively re-crystalized.

5. The method for manufacturing a semiconductor device of claims 2, wherein a p-type layer of the PIN diode is selectively re-crystalized.

6. The method for manufacturing a semiconductor device of claim 2, wherein a bonding region between an n-type layer and an i-type layer, and a bonding region between a p-type layer and the i-type layer of the PIN diode are selectively re-crystalized.

7. The method for manufacturing a semiconductor device of claim 2, wherein a region excluding a bonding region between an n-type layer and an i-type layer and a bonding region between a p-type layer and the i-type layer of the PIN diode is selectively re-crystalized.

8. The method for manufacturing a semiconductor device of claim 2, wherein an upper layer part of the PIN diode is selectively re-crystalized.

9. The method for manufacturing a semiconductor device of claim 2, wherein an upper layer part of the PIN diode is selectively oxidized.

10. The method for manufacturing a semiconductor device of claim 9, wherein an upper layer part of a p-type layer and an upper layer part of an n-type layer of the PIN diode are selectively oxidized.

11. The method for manufacturing a semiconductor device of claim 9, wherein an upper layer part of an i-type layer of the PIN diode is selectively oxidized.

12. The method for manufacturing a semiconductor device of claim 9, wherein an upper layer part of a region excluding a bonding region between an n-type layer and an i-type layer and a bonding region between a p-type layer and the i-type layer of the PIN diode is selectively oxidized.

13. A PIN diode wherein the PIN diode is made of polysilicon or amorphous silicon, and
   part of the PIN diode is selectively oxidized or sublimated so that the PIN diode is divided into a plurality of diodes.

14. The PIN diode of claim 13, wherein re-crystallization, oxidization, or change of grain size is selectively performed in part of the plurality of diodes.

* * * * *